United States Patent [19]
Virva

[11] 4,164,988
[45] Aug. 21, 1979

[54] FINE TUNED, COLUMN SPEAKER SYSTEM

[75] Inventor: John J. Virva, Chicago, Ill.

[73] Assignee: Admiral Corporation, Schaumburg, Ill.

[21] Appl. No.: 717,755

[22] Filed: Aug. 25, 1976

[51] Int. Cl.$^2$ .................... H05K 5/00

[52] U.S. Cl. .................... 181/156; 181/153; 181/155; 181/199

[58] Field of Search .................... 181/148, 156, 155, 153, 181/199, 150, 151, 160, 166; 179/1 E

[56] References Cited

U.S. PATENT DOCUMENTS

| | | | |
|---|---|---|---|
| 3,151,699 | 10/1964 | Peavey | 181/156 |
| 3,327,808 | 6/1967 | Shaper | 181/153 |
| 3,394,773 | 7/1968 | Kowalik et al. | 181/145 |
| 3,443,660 | 5/1969 | Virva et al. | 181/153 |
| 3,523,589 | 8/1970 | Virva | 181/151 |
| 3,529,691 | 9/1970 | Wesemann | 181/156 |
| 3,945,461 | 3/1976 | Robinson | 181/156 |

FOREIGN PATENT DOCUMENTS

| | | | |
|---|---|---|---|
| 51523 | 4/1936 | Denmark | 181/199 |
| 129633 | 10/1928 | Switzerland | 181/148 |

*Primary Examiner*—Stephen J. Tomsky
*Attorney, Agent, or Firm*—R. Lewis Gable

[57] ABSTRACT

A loudspeaker system is disclosed having a rigid framework which contains a high compliance loudspeaker connected to an adjustable air column tube. The adjustable air column tube provides exact ¼ wavelength tuning for the speaker system, to further improve its low frequency response, in accordance with tuned enclosure theory.

4 Claims, 6 Drawing Figures

FINE TUNED, COLUMN SPEAKER SYSTEM

BACKGROUND OF THE INVENTION

This invention pertains to loudspeakers in general and, in particular, to economical loudspeakers for high fidelity reproduction which do not require conventional speaker enclosures. More specifically, this invention pertains to variably tuned air column loudspeaker systems.

It is well known that loudspeakers radiate sound from both the front and rear of the speaker cone, and that the air in front of the cone is compressed and simultaneously the air in the rear of the cone is rarefied, when the speaker cone is pushing air in front of it. Since sound compressions and rarefactions are 180 degrees out of phase with each other, the sound in front of the cone is out of phase with that radiated from the rear; therefore, when these two out-of-phase sound waves meet, they cancel or short circuit each other. This cancellation affects primarily the low-frequency sound, since high frequency sound is radiated in the form of beams, which do not meet.

In the past, the obvious answer to this situation was to put some sort of obstacle around the speaker to prevent the front and rear sound waves from reaching each other. These obstacles have generally been in the form of baffles and were designed with the theory that the longer the path length from front to rear compared to the wavelength of the sound to be radiated, the less cancellation would take place. Several types of baffles evolved from this theory beginning with the flat open baffle, which mostly comprised a large flat wooden board.

Following the flat open baffle, came the open back enclosure, the infinite baffle, the bass-reflex enclosure, and the labyrinth enclosure. Each of these baffles added to and improved the quality of loudspeaker systems, particularly in the low frequency range.

The infinite baffle, which was basically a sealed box, had undesirable qualities which made it impractical. It wasted the sound output from the rear of the speaker cone; it had undesirable damping effects on the speaker, and it was a very large box that required a great space. However, the inherent defects of the infinite baffle were overcome by a revolutionary principle of speaker and baffle design known as acoustic suspension. The elastic suspensions of the conventional loudspeakers cannot reproduce the large excursions demanded by low bass frequencies, without considerable distortion. Acoustic suspension avoids this difficulty by vastly increasing the "compliance" of the mechanical spring suspensions and then compensating up for the lost spring action through a pneumatic spring consisting of the compressed air in the sealed box. The speaker is acoustically suspended in the infinite baffle, which is calculated to provide the proper amount of pneumatic spring action through its sealed-in air. The pneumatic spring action is linear, hence distortion free.

An alternative, earlier approach consisted of providing an additional opening, or air vent, in the front of an infinite baffle, whereby the sound energy from the rear of the speaker can be used. This was called the bass-reflex enclosure, and has become one of the most popular hi-fi baffles. The bass-reflex enclosure is essentially a phase inverter for low frequency sound waves. By making the length of the acoustic path from the rear of the speaker to the opening just right by proper tuning of its enclosure, the rear wave can be delayed sufficiently so that it emerges from the opening in phase with the front wave and thus reinforces it. As a result of this reinforcing action, the low-frequency output at certain frequencies can be twice that of an infinite baffle.

Labyrinth speakers are described in an article entitled, "Labyrinth Speakers for Hi-Fi", by David B. Weims, and appearing in the January 1972 issue of *Popular Electronics.* As stated therein, the labyrinth speaker is a tuned pipe or tube with an open end, into one end of which is mounted a transducer or speaker. When the wave from the speaker reaches the other remote end of the pipe, it spreads out into the listening environment, causing a sudden pressure drop which reflects back through the pipe to the speaker as a rarefaction. At the quarter-wave frequency ($\lambda/4$) of the sound, the air in the mouth of the pipe is at minimum velocity, but maximum pressure (Bernoulli's Theorem). This condition produces an accompanying, maximum rarefaction reflected back to the speaker cone. Hence, the anti-resonant action of the pipe or tubular enclosure offers maximum damping to the speaker if the length of the pipe is adjusted to the quarter-wave frequency of the sound produced by the speaker.

At the frequency at which the length of the pipe is a half-wave ($\lambda/2$) of the sound, the air in the mouth of the tubular enclosure is at low pressure, but high velocity. Because there is no sudden change in pressure as the wave moves out of the pipe or tubular enclosure, there is no anti-resonance action by the pipe, and the speaker cone is able to move freely, and because of the $\lambda/2$ phase shift (180) within the tubular enclosure, the emerging wave is in-phase with that coming from the front of the speaker, adding to the speaker's output. In the noted article, there are disclosed various configurations by which the desired labyrinth enclosure may be formed, all of which are characterized as being necessarily rigid enclosures, either of the type having a series of walls protruding within an essentially rectangular enclosure or of a pipe-type enclosure, wherein both the effective length of the labyrinth is said to be approximately one-fourth wavelength of the natural resonance frequency of the speaker, which is inserted into the labyrinth enclosure. Similar labyrinth disclosures also are disclosed by U.S. Pat. Nos. 3,443,660, 3,523,589 and 3,687,220 of the inventor of this invention and assigned to the assignee of this invention; likewise, they are characterized by disclosing a relatively rigid enclosure.

In the prior art design labyrinth speakers, it is well-known to determine the length of the labyrinth speaker to be approximately one-fourth wavelength of the sound reproduced. As noted at page 44 of the above-identified article, "The performance of a straight open pipe can be predicted, but for a pipe that is both folded and stuffed, one needs a crystal ball". Further, it is desired to design the speaker enclosure to make it aesthetically appealing as a piece of furniture, and therefore it is not always desirable to incorporate a straight, rigid pipe of the desired wavelength, which might otherwise adversely affect the furniture design of this type of enclosure. In addition, the natural resonant frequency $f_o$ of the speaker incorporated into such an enclosure is not readily controlled by the manufacturer, and only in the most expensive speakers is the natural resonant wavelength predictable from speaker to speaker. Thus, in minimizing the overall cost of the speaker system, it would be desirable to use relatively low-cost speakers, the resonant frequency wavelengths of which may vary considerably, as much as ±20% from speaker to speaker. Therefore, it is highly desirable to provide some type of adjustment to compensate for varying speakers to be enclosed that otherwise would be impossible with a rigid speaker enclosure.

SUMMARY OF THE INVENTION

It is therefore a prime object of this invention to provide a loudspeaker system with a variable-tuned air column enclosure.

A further object of this invention is to provide an inexpensive loudspeaker system which can be exactly tuned to receive a variety of inexpensive loudspeakers whose natural resonant frequency may well vary.

Another object of this invention is to provide a loudspeaker system with improved bass response.

In accordance with these and other objects, this invention provides a speaker enclosure that may be adjusted as to its length, and thus precisely tuned to receive a speaker whose resonant frequency may be within a relatively large range. To this end there is provided a unique flexible tube and support for adjusting the tube length in accordance with the particular loudspeaker it is to be used. The loudspeaker and flexible air column tube are assembled in the factory and an impedance check is done while varying the tube length to precisely tune the system to ¼ wavelength of the in-air resonance of the speaker.

DESCRIPTION OF THE DRAWINGS

These and other objects, features and advantages of the invention will be readily apparent from the following description of the preferred embodiments thereof, taken in conjunction with the accompanying drawings.

DESCRIPTION OF THE PREFERRED EMBODIMENTS

Figure 2:
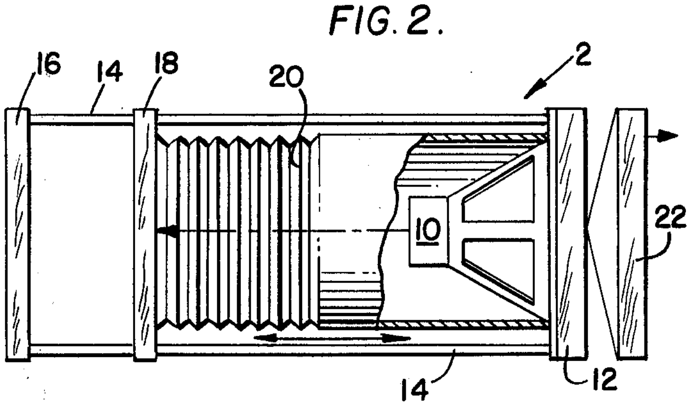
FIG. 2 is a side view of the loudspeaker and air column.

With regard to the drawings and in particular to FIG. 2, there is shown a small diameter, high compliance speaker 10, such as a Model No. 78C 253-2 as supplied by Admiral, mounted by means of bolts or some other suitable fasteners to a baffle board 12, which is constructed of plywood or other similar materials. The baffle board 12 is generally square in shape and is of approximate size to fit into an aperture formed by walls of a cabinet or other piece of furniture (not shown), which may be designed for appearance without other considerations of sound reproduction. Connected to the baffle board 12 are support rods 14 which are fixedly connected to a rigid support member 16. An opening is provided in the baffle board 12 for receiving the speaker 10 and through which the speaker sound is transmitted. Slideable on the support rods is an adjustable board 18 containing a telescopic column or tube 20. The tube 20 is fixedly attached to the back of loudspeaker 10 at one end and to an aperture in adjustable board 18 at the other end. The adjustable board 18 slides along support rods 14 in the direction of the arrows to adjust the length of air column 20 to ¼ wavelength. In front of the baffle board 12 is a deflector board 22 having a relatively hard, acoustically reflective surface to deflect the high and midrange sound frequencies into the listening area. The deflector board 22 does not form part of the present invention; however, it does give good dispersion to the middle and high frequencies when spaced from the front of the loudspeaker approximately one inch.

Figure 1:
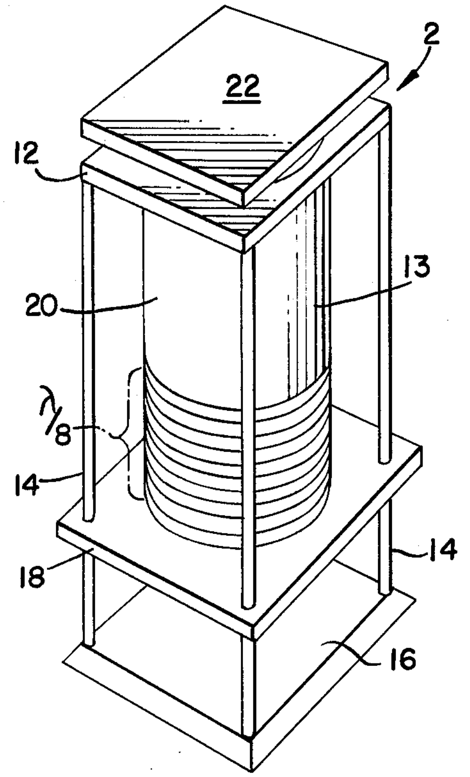
FIG. 1 is an exploded perspective view of the loudspeaker and air column of this invention.

In FIGS. 1 and 2, the loudspeaker 10 and column 20 are shown standing on an adjustable support member 18 with the loudspeaker 10, mounted to baffle board 12, and partially covered by deflector board 22. In a significant aspect of this invention, the column 20 is made of a material that is relatively flexible, to the extent that the length of the column may be adjusted. In one particular embodiment of this invention, at least a portion, illustratively shown as one-half of the column or one-eighth of the wavelength of the natural resonance of the speaker 10, is made of an accordion-like material such as that incorporated into a typical exhaust conduit for a home laundry-dryer. Typically, such accordion-like material is made of a polyvinyl propylene or other similar synthetic plastic material or rubber composition on a spring wire frame. The basic criteria for this material is that there should be sufficient mass to contain the air column at the tuned, resonant frequency such as to not allow undue flexing or mechanical vibration. The use of the accordion-like material permits the support member 18 to be adjustably disposed upon a loudspeaker support frame comprised of a base 16, and the rods 14 to maximize the bass or low-frequency response of the speaker 10 and in particular to set the length of the column at approximately one-fourth wavelength of the natural frequency of the speaker 10, thus precisely fine-tuning the entire speaker system.

High-compliance loudspeakers require an air spring (as by a sealed chamber-type enclosure) to handle acoustical power. It is well known that conventional vented enclosure techniques for such speakers are unsatisfactory. It is also well known that placing a speaker in a sealed chamber type housing raises the resonant frequency of the system above that of the free air resonance of the speaker unless the enclosure is large enough to be considered "infinite". However, high-compliance speakers may be readily constructed with such low resonant frequencies that the increase in resonant frequency of the system experienced when mounting the speaker in a folded column enclosure still results in a speaker-enclosure combination capable of faithful sound reproduction, especially in the low frequency range. This was disclosed in my prior U.S. Pat. No. 3,523,589—Virva—"High-Compliance Speaker and Enclosure Combination". It is now realized that a similar type of response is obtainable when a high compliance speaker is used in an air column loudspeaker system.

As previously stated, loudspeakers vary in their characteristic resonant frequency from speaker to speaker; therefore, by using an adjustable column 10 whose length can be voiced during the manufacturing process, the cost of the speaker system and in particular the speaker to be incorporated therein, can be greatly reduced while obtaining much higher quality sound reproduction. In the assembling of a speaker system such as that shown in FIGS. 1 and 2, it is contemplated that the length of the column 20 could be empirically adjusted by an assembler to set that length of the column 20 at which the greatest low frequency response was heard. In a more sophisticated method of assembly, the speaker 10, before it is inserted into its enclosure, is energized by a variable-toned generator, while measuring the voltage across the voice coil of speaker 10 with an RMS volt meter, thereby to determine with accuracy the in-air speaker resonant frequency ($f_o$) of that particular speaker. Thereafter, the length as one-fourth wavelength of the resonant frequency ($f_1$) may be readily determined and the physical length of the column 20 set to a suitable measurement. The proper length is established for each air column tube and adjustable board 18 is locked into place by some conventional locking means, not shown, preventing the air column from moving out of adjustment.

At ¼ of a wavelength, the column tube 20 acts as an anti-resonant device, and backloads speaker 10. Thus, at ¼ wavelength, the air column tube 20 will produce a phase inversion and become a reinforcer; therefore the air column tube is both a speaker enclosure and a reinforcer for the resonant frequency. It is possible with proper tuning to adjust the low frequency range as low as 30 Hz, with 40 to 50 Hz being the most common tuning range using the flexible air column speaker system.

Figure 3:
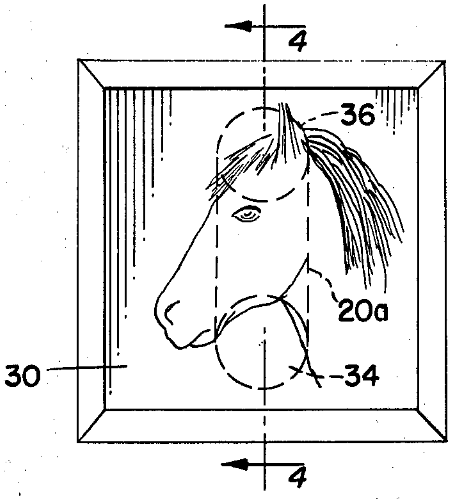
FIG. 3 is a decorative picture frame containing a loudspeaker and air column system of this invention.
Figure 4:
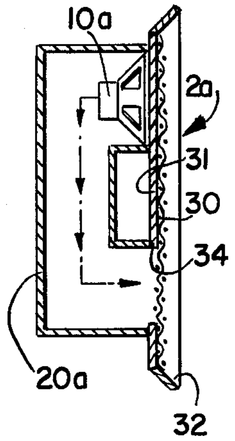
FIG. 4 is a cross sectional view of FIG. 3 shown along the lines 4—4.

In FIG. 3, a modified form of the invention is shown wherein the speaker system is hidden behind a picture 30 and frame 32. FIG. 4 is a cross-sectional view of the picture and picture frame showing a speaker **10*a* mounted behind the picture and a column tube 20*a* of selected length and having a front opening 34 in the picture 30. The front openings for the speaker 36 and the air column 34 are concealed by the picture proper. As with the speaker system of FIGS. 1 and 2, it is necessary to pre-select the length of the column 20*a*** to ¼ of a wavelength to give the proper resonant frequency response.

Figure 5:
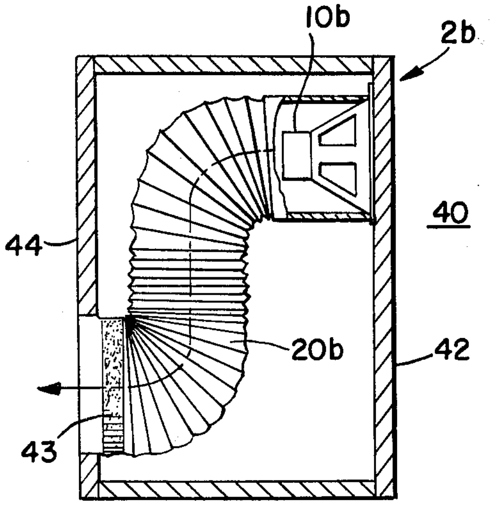
FIG. 5 is a modified cross sectional view of another embodiment of the loudspeaker and air column system.

In a further embodiment as shown in FIG. 5, the speaker system is mounted in an enclosure 40 which has a front baffle 42 in which a loudspeaker **10*b* is mounted. The speaker has side, front and rear walls with an opening in the rear wall 44 for a flexible column tube 20*b*. The column tube 20*b* is mounted in the enclosure such that it connects to the back of loudspeaker 10*b* and is open to the rear of the enclosure 40 with an effective overall length of ¼ of a wavelength. At the remote end of the tube 20*b*, a damping material in the form of a circular member 43** of a suitable acoustic material is inserted to act as a damping means for mid- and high-range frequencies that otherwise would escape to some degree from the remote end and interfere with the sound quality of the entire speaker system.

Figure 6:
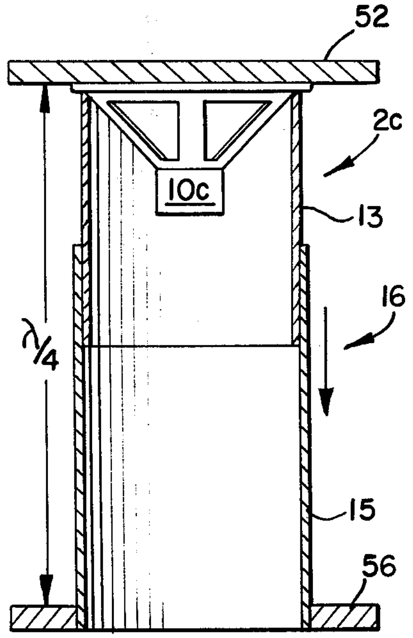
FIG. 6 is a further modification of the loudspeaker and air column system.

Further modification of the invention is shown in FIG. 6 where a loudspeaker **10*c* is mounted to a baffle board 52, and the back of the loudspeaker 10*c* is attached to a telescopic column tube 16 with a fixed tube section 13 and a slideable tube section 15. Mounted to tube 15 is a support 56**. As in the prior disclosed air column-speaker systems the length of the telescopic air column tube is preadjusted to ¼ of a wavelength. This particular speaker system is designed for use in automobiles and the like. In a further embodiment (not shown), it is contemplated that a length of a suitable flexible material that otherwise could not be adjusted for length but could be shaped to fit into practically any type of spacing, for example, the trunk of a car. In such an application, the tubing and the speaker would be assembled during the manufacturing process, in which the length of the tubing would be adjusted for the natural resonant frequency of the speaker, as explained above, as by cutting the length of the flexible column. Thereafter, the prospective user could mount such an assembly within his car, for example in his trunk, and dispose the flexible tubing in a manner so as not to interfere with the storage-handling capacity of his automobile's trunk.

The loudspeakers supports and baffle boards of the various modifications may be of a plywood or particle board material. Further, the adjustable board may be of a similar plywood or particle board material. Likewise the support rods can be either of metal or wood.

With a loudspeaker-air column system combination of such small size and relevantly low cost, it will be immediately apparent that vast freedom of cabinetry design becomes available. No longer need a home hi-fi or stereophonic console be of massive proportions to reproduce good low frequency sound. With the small overall size and especially the small frontal speaker radiation area of the instant speaker system, the cabinet dimensions and styles are almost unrestricted. For example, as shown in the drawings, a picture frame and picture can completely house a stereophonic or hi-fi system of the invention. The cross sectional view shows the combination of the invention in position. It will be readily apparent that the speaker air column combination may be placed upright, which allows the design to be used in cabinet structures, desks, cocktail tables or coffee tables housing, for example.

A major advantage of the speaker-air column system combination is its simplicity in construction. This construction gives rise to some substantial savings in design of the console cabinetry for housing the system. No longer need the cabinet provide the acoustical rigidity formerly required, but may serve as a decorative piece of furniture into which the speaker-air column system combination of the invention are inserted. In more expensive units it may be desirable to provide more power handling capability, two or more of the speaker-air column combinations may be used together.

What is claimed is:

1. A finely-tuned loudspeaker system capable of reproducing efficiently low frequency sounds, comprising:

(a) a high compliance loudspeaker having a specific in-air resonance frequency $f_o$, which may vary within a relatively wide range of possible frequencies;

(b) support means for said loudspeaker comprising a baffle board for receiving and supporting said loudspeaker, a support frame and a slideable board with an aperture in said board slideable in said support frame; and (c) an adjustable air column tube connected at one end to the rear of said loudspeaker and connected at the other end to said slideable board, said air column tube being open from said loudspeaker through said slideable board, said air column tube being adjustable so that its length may be infinitely varied over a relatively wide range corresponding to said range of possible frequencies to one-quarter of a wavelength of the specific frequency $f_o$, whereby said loud-speaker system may be finely tuned to tend to flatten the output of said speaker over the frequency range of said speaker.

2. A finely-tuned loudspeaker system as in claim 1, wherein said loudspeaker support frame comprises a base support, and a plurality of support rods, said loudspeaker being mounted on said baffle board, and said slideable board being slideable on said support rods.

3. A finely-tuned loudspeaker system as in claim 1, wherein said adjustable air column tube is a flexible, accordion-type tube.

4. A finely-tuned loudspeaker system as in claim 3, wherein said air column tube has a rigid section which connects to said loudspeaker and a flexible section which connects to said slideable board.

* * * * *